United States Patent
Hekmat et al.

(10) Patent No.: US 9,712,177 B1
(45) Date of Patent: Jul. 18, 2017

(54) FRACTIONAL PLL USING A LINEAR PFD WITH ADJUSTABLE DELAY

(71) Applicant: Samsung Display Co., Ltd., Yongin-si (KR)

(72) Inventors: Mohammad Hekmat, Mountain View, CA (US); Jalil Kamali, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/991,898

(22) Filed: Jan. 8, 2016

(51) Int. Cl.
| | |
|---|---|
| *H03L 7/197* | (2006.01) |
| *H03L 7/089* | (2006.01) |
| *H03L 7/091* | (2006.01) |
| *H03L 7/093* | (2006.01) |
| *H03K 5/131* | (2014.01) |
| *H03K 5/00* | (2006.01) |

(52) U.S. Cl.
CPC ......... *H03L 7/1974* (2013.01); *H03K 5/131* (2013.01); *H03L 7/0891* (2013.01); *H03L 7/091* (2013.01); *H03L 7/093* (2013.01); *H03K 2005/00058* (2013.01)

(58) Field of Classification Search
CPC ..... H03L 7/1974; H03L 7/0891; H03L 7/091; H03L 7/093; H03K 5/131; H03K 5/133; H03K 7/08
USPC ................................ 327/147, 156, 158, 161
See application file for complete search history.

(56) References Cited

U.S. PATENT DOCUMENTS

| | | | |
|---|---|---|---|
| 7,005,928 B2 | 2/2006 | Albasini et al. | |
| 7,365,607 B2 | 4/2008 | Fahim | |
| 7,398,071 B2 | 7/2008 | Jensen | |
| 7,548,123 B2 | 6/2009 | Frey | |
| 7,609,117 B2 * | 10/2009 | Milani | H03L 7/1974 331/16 |
| 7,728,631 B2 | 6/2010 | Nathawad | |
| 8,031,008 B2 | 10/2011 | Wang et al. | |
| 8,207,766 B2 | 6/2012 | Yu | |
| 8,222,936 B2 | 7/2012 | Friedman et al. | |
| 8,866,519 B1 | 10/2014 | Hiebert | |
| 8,890,624 B2 | 11/2014 | Chen et al. | |
| 8,901,997 B2 | 12/2014 | Nowatzyk | |
| 2013/0027102 A1 | 1/2013 | Chen et al. | |

OTHER PUBLICATIONS

Milicevic, S., A frequency synthesizer with frequency divider and frequency multiplier for spur reduction, Ph.D. Dissertation, Carleton University, pp. 1-196, 2008, ISBN 9780494439005.

* cited by examiner

*Primary Examiner* — John Poos
(74) *Attorney, Agent, or Firm* — Lewis Roca Rothgerber Christie LLP

(57) ABSTRACT

A phase-locked loop. The phase-locked loop includes a voltage-controlled oscillator having: a control input, and a clock output; and a phase frequency detector having: a reference clock input, a feedback clock input, an up output configured to be either in a set state or a reset state, and a down output configured to be either in a set state or a reset state. The up output and the down output are connected to the control input. The clock output is connected to the feedback clock input. The phase frequency detector includes an adjustable delay block configured to delay, by an adjustable delay time: a transition of the up output from the set state to the reset state, and a transition of the down output from the set state to the reset state.

20 Claims, 10 Drawing Sheets

FRACTIONAL PLL USING A LINEAR PFD WITH ADJUSTABLE DELAY

FIELD

One or more aspects of embodiments according to the present invention relate to phase locked loops, and more particularly to a fractional phase locked loop having a phase frequency detector with a variable delay.

BACKGROUND

In any communication application, there may be a need for a clock signal. Such a signal may be generated from a reference frequency using a phase-locked loop (PLL). The relationship between the frequency of the incoming reference clock and that of the output of the PLL may be determined by the division ratio of a divider in the feedback path of the PLL. In an integer-N PLL, the output frequency is an integer multiple of the reference frequency. In such a PLL, the resolution of the output frequency may be limited to N times the reference frequency resolution. In some applications it may be desirable to achieve a finer resolution. One solution is to employ fractional-N PLLs, in which the output frequency may be a non-integer multiple of the reference frequency. Such a PLL may employ dual-mode dividers in the feedback path and may require a sigma-delta modulator to improve jitter degradation due to modulation of the division ratio. The complexity of the divider, its power overhead and the necessity of a sigma-delta modulator may be drawbacks of this method.

Thus, there is a need for a fractional-N PLL of low complexity that does not employ a sigma-delta modulator.

SUMMARY

According to an embodiment of the present invention there is provided a phase-locked loop, including: a voltage-controlled oscillator having: a control input; and a clock output; and a phase frequency detector having: a reference clock input; a feedback clock input; an up output configured to be either in a set state or a reset state; and a down output configured to be either in a set state or a reset state, the up output and the down output of the phase frequency detector being operably connected to the control input of the voltage-controlled oscillator, the clock output of the voltage-controlled oscillator being operably connected to the feedback clock input of the phase frequency detector, the phase frequency detector including an adjustable delay block configured to delay, by an adjustable delay time: a transition of the up output from the set state to the reset state, and a transition of the down output from the set state to the reset state.

In one embodiment, the phase frequency detector includes: a first flip-flop operably connected to the reference clock input; a second flip-flop operably connected to the reference clock input; the adjustable delay block, operably connected to a reset input of each of: the first flip-flop; and the second flip-flop; and an AND gate operably connected to an output of each of: the first flip-flop; and the second flip-flop; and an output of the AND gate being operably connected to an input of the adjustable delay block.

In one embodiment, the adjustable delay block includes a current mode logic stage with adjustable bandwidth.

In one embodiment, the adjustable delay block includes a current-starved inverter.

In one embodiment, the adjustable delay block includes a first plurality of inverters operably connected in cascade.

In one embodiment, an inverter of the first plurality of inverters is a current-starved complementary metal-oxide semiconductor inverter.

In one embodiment, the adjustable delay block further includes a multiplexer with a plurality of inputs each operably connected to an output of a respective inverter of the plurality of inverters.

In one embodiment, the adjustable delay block further includes a second plurality of inverters operably connected in cascade, each of the inverters of the second plurality of inverters having a different propagation delay from a corresponding inverter of the first plurality of inverters.

In one embodiment, the phase-locked loop includes an array of switches, each switch of the array of switches being operably connected between an output of an inverter of the first plurality of inverters and an output of an inverter of the second plurality of inverters.

In one embodiment, the phase-locked loop includes a delay controller, having an output operably connected to a control input of the adjustable delay block.

In one embodiment, the delay controller further has a first input operably connected to the reference clock input, and a second input operably connected to the feedback clock input.

In one embodiment, the delay controller is configured to count edges of respective signals at the reference clock input and at the feedback clock input.

In one embodiment, the phase-locked loop includes the adjustable delay block, the control loop having a bandwidth less than a control bandwidth of a control loop, of the phase-locked loop, including the voltage-controlled oscillator.

In one embodiment, the phase-locked loop includes a voltage source configured to be selectively operably connected to the control input of the voltage-controlled oscillator.

In one embodiment, the adjustable delay block includes a first plurality of inverters operably connected in cascade.

In one embodiment, the adjustable delay block further includes a multiplexer with a plurality of inputs each operably connected to an output of a respective inverter of the plurality of inverters.

In one embodiment, the adjustable delay block further includes a second plurality of inverters operably connected in cascade, each of the inverters of the second plurality of inverters having a different propagation delay from a corresponding inverter of the first plurality of inverters.

In one embodiment, the phase-locked loop includes an array of switches, each switch of the array of switches being operably connected between an output of an inverter of the first plurality of inverters and an output of an inverter of the second plurality of inverters.

According to an embodiment of the present invention there is provided a display, including: a reference oscillator; and a timing controller, the timing controller including a phase-locked loop, including: a voltage-controlled oscillator having: a control input; and a clock output; and a phase frequency detector having: a reference clock input operably connected to an output of the reference oscillator; a feedback clock input; an up output configured to be either in a set state or a reset state; and a down output configured to be either in a set state or a reset state; the up output and the down output of the phase frequency detector being operably connected to the control input of the voltage-controlled oscillator, the clock output of the voltage-controlled oscillator being operably connected to the feedback clock input of the phase frequency detector, the phase frequency detector including an adjustable delay block configured to delay, by an adjustable delay time: a transition of the up output from the set state to the reset state, and a transition of the down output from the set state to the reset state.

According to an embodiment of the present invention there is provided a method for operating a phase-locked loop, the phase-locked loop including: a voltage-controlled oscillator having: a control input; and a clock output; and a phase frequency detector having: a reference clock input; a feedback clock input; an up output configured to be either in a set state or a reset state; and a down output configured to be either in a set state or a reset state, the up output and the down output of the phase frequency detector being operably connected to the control input of the voltage-controlled oscillator, the clock output of the voltage-controlled oscillator being operably connected to the feedback clock input of the phase frequency detector, the phase frequency detector including an adjustable delay block, the method including: delaying, by the adjustable delay block, by an adjustable delay time, a transition of the up output from the set state to the reset state, and delaying, by the adjustable delay block, by the adjustable delay time, a transition of the down output from the set state to the reset state.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a fractional PLL using a linear PFD with adjustable delay provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Embodiments of the present invention are directed to a phase-locked loop (PLL) that is similar in construction to an integer-N PLL, and that, as a result, may lack dual-mode dividers and the associated sigma-delta modulator loop. Instead of achieving a non-integer ratio through the feedback path, a non-integer ratio may be achieved by using the linear phase/frequency detector, that may be in the forward path of the PLL, to modulate the output frequency.

Figure 1:
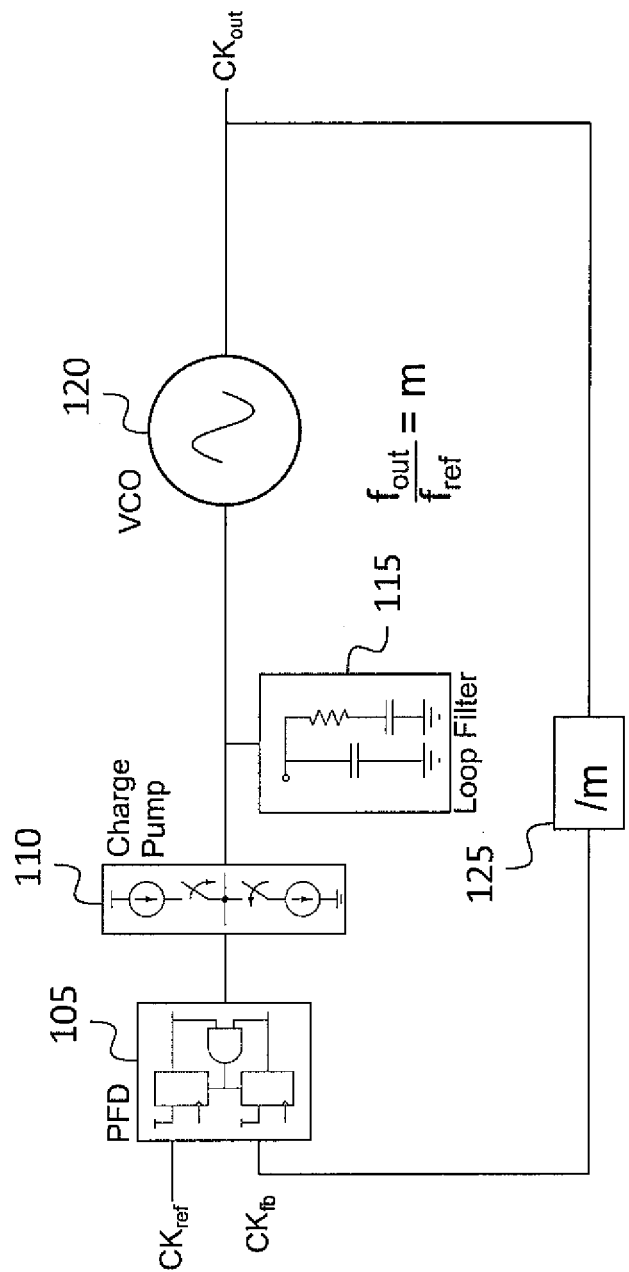
FIG. 1 is a block diagram of a related art integer-N phase locked loop.

Referring to FIG. 1, in a related art integer-N PLL, the phase frequency detector (PFD) 105 generates up and down signals for the subsequent charge pump circuit 110, which is connected, through a loop filter 115, to a voltage controlled oscillator (VCO) 120. A divider 125 that divides the frequency by m (where m is an integer, and $f_{out}/f_{ref}=m$, $f_{out}$ being the output frequency and $f_{ref}$ being the reference frequency) is connected to the output of the VCO 120 and to the feedback clock input of the PFD 105. Under locked conditions, the up and down signals are essentially the same, and consequently the frequency remains essentially constant.

Figure 2:
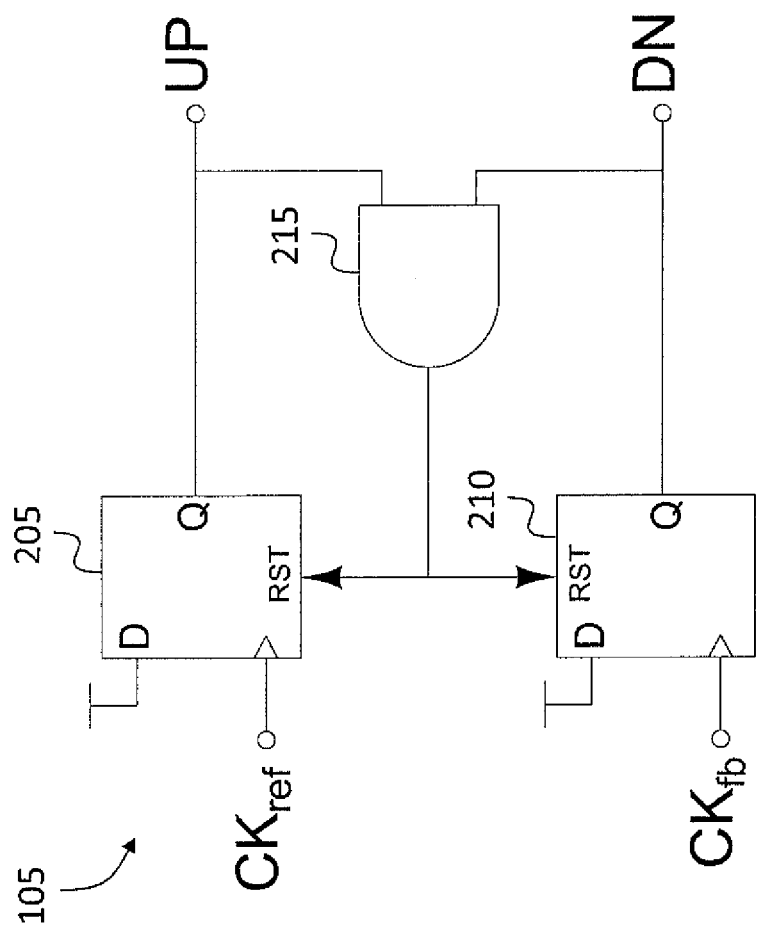
FIG. 2 is a schematic diagram of a related art phase frequency detector.

The PFD 105 may include a first flip-flop 205, a second flip-flop 210 and an AND gate 215 as shown in FIG. 2. When reset ("RST") is not asserted, a rising clock edge at the clock input of either of the flip-flops 205, 210 causes the flip-flop output (e.g., the "Q" output) to transition (from a reset state) to a set state (e.g., logic 1). When both of the flip-flop outputs are in the set state, the AND gate asserts the reset signal, causing both flip-flop outputs to transition to the reset state (e.g., logic 0). During the interval of time beginning when the reset signals of the flip-flops are asserted and ending when the reset signals are de-asserted, any clock edges received at either flip-flop have no effect.

Figure 3:
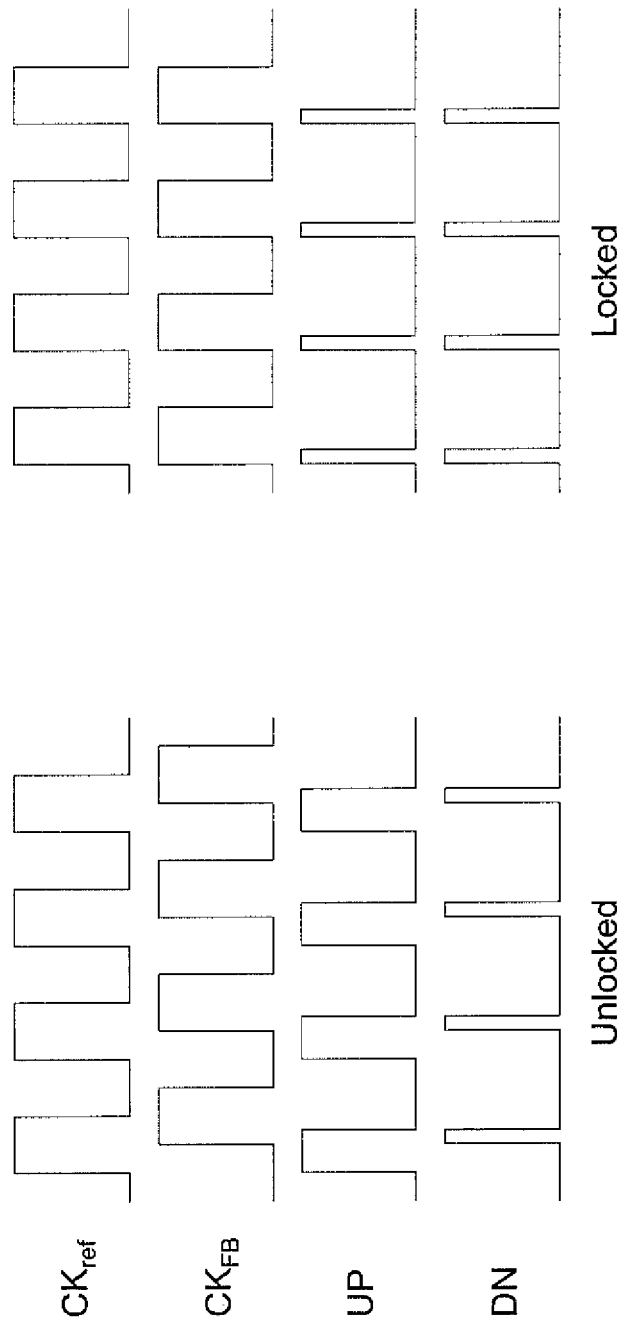
FIG. 3A is a waveform diagram for unlocked-state signals at a phase frequency detector, according to an embodiment of the present invention.
FIG. 3B is a waveform diagram for locked-state signals at a phase frequency detector, according to an embodiment of the present invention.

Referring to FIGS. 3A and 3B, the outputs of the PFD are pulses the widths of which are determined by the phase difference between the two input clocks. Under unlocked conditions (FIG. 3A) the up and down signals have pulses of different widths. Once the PLL locks, i.e., the phase and frequency of the reference and feedback clocks match, the up and down signals become essentially equal (FIG. 3B). The minimum width of each up or down pulse is the sum of (i) the delay from the reset of a flip-flop to the output of the flip-flop and (ii) the AND gate delay. In the timing diagrams of FIGS. 3A and 3B, the propagation delay forward through each flip-flop is negligible; this is not essential, however, and in some embodiments the forward propagation delay may be significant.

As mentioned above, while the reset signal is asserted the PFD ignores the input clock edge, leading to a missed edge. This phenomenon may be referred to as cycle slip and may occur in the transient behavior of a PLL. In steady state a wide enough reset signal may cause a systematic missing of edges, e.g., if in every 10 edges of the reference clock one edge falls in the reset period, the PLL may behave as though 10 up pulses and 9 down pulses had been received, and the charge pump may increase or decrease the VCO control signal accordingly. If this missing edge happens periodically under steady state conditions, the PLL may lock to a fraction of the reference frequency, e.g., either 9/10 or 10/11 of the reference frequency depending on whether up pulses or down pulses are missed.

Figure 4:
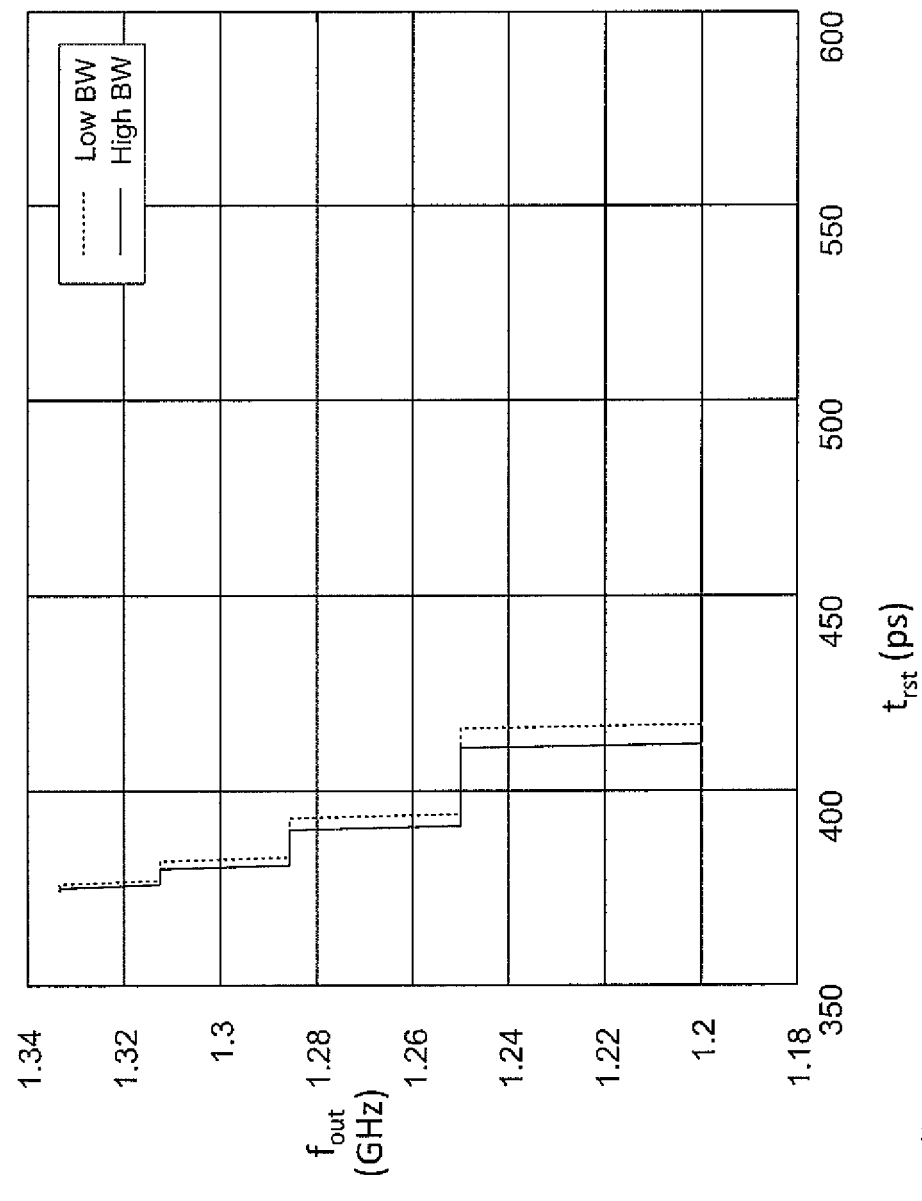
FIG. 4 is a graph of output frequency vs. reset interval length, according to an embodiment of the present invention.
Figure 5:
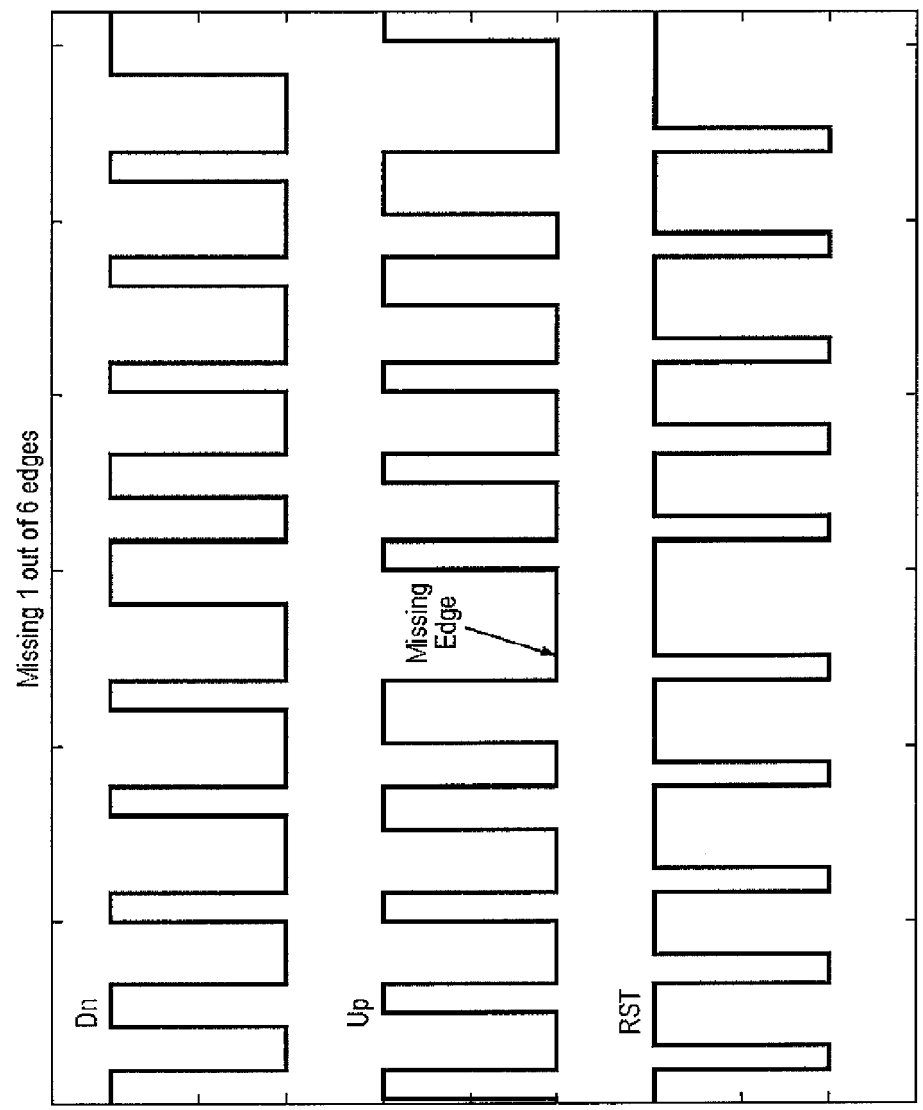
FIG. 5 is a waveform diagram for signals at a phase frequency detector, according to an embodiment of the present invention.

The frequency with which a missed up or down pulse occurs (and, accordingly, the ratio of the feedback clock frequency to the reference clock frequency when the mean charge pump output is zero) depends on the loop bandwidth as well as the width of the reset pulse. FIG. 4 shows the output frequency as a function of reset pulse width, as calculated using a simulation for a 1.5 GHz PLL. FIG. 5 shows a timing diagram for an example in which one of every 6 edges of the reference clock occurs during the reset interval and is missed, and, as a result, a corresponding up pulse (that would have been present if the reset interval had zero length) is periodically absent. In some embodiments (corresponding, e.g., to the timing diagram of FIG. 5), the reset input of the flip-flops may be active low, and a NAND gate may be used in place of the AND gate 215 of the embodiment of FIG. 2.

Figure 6:
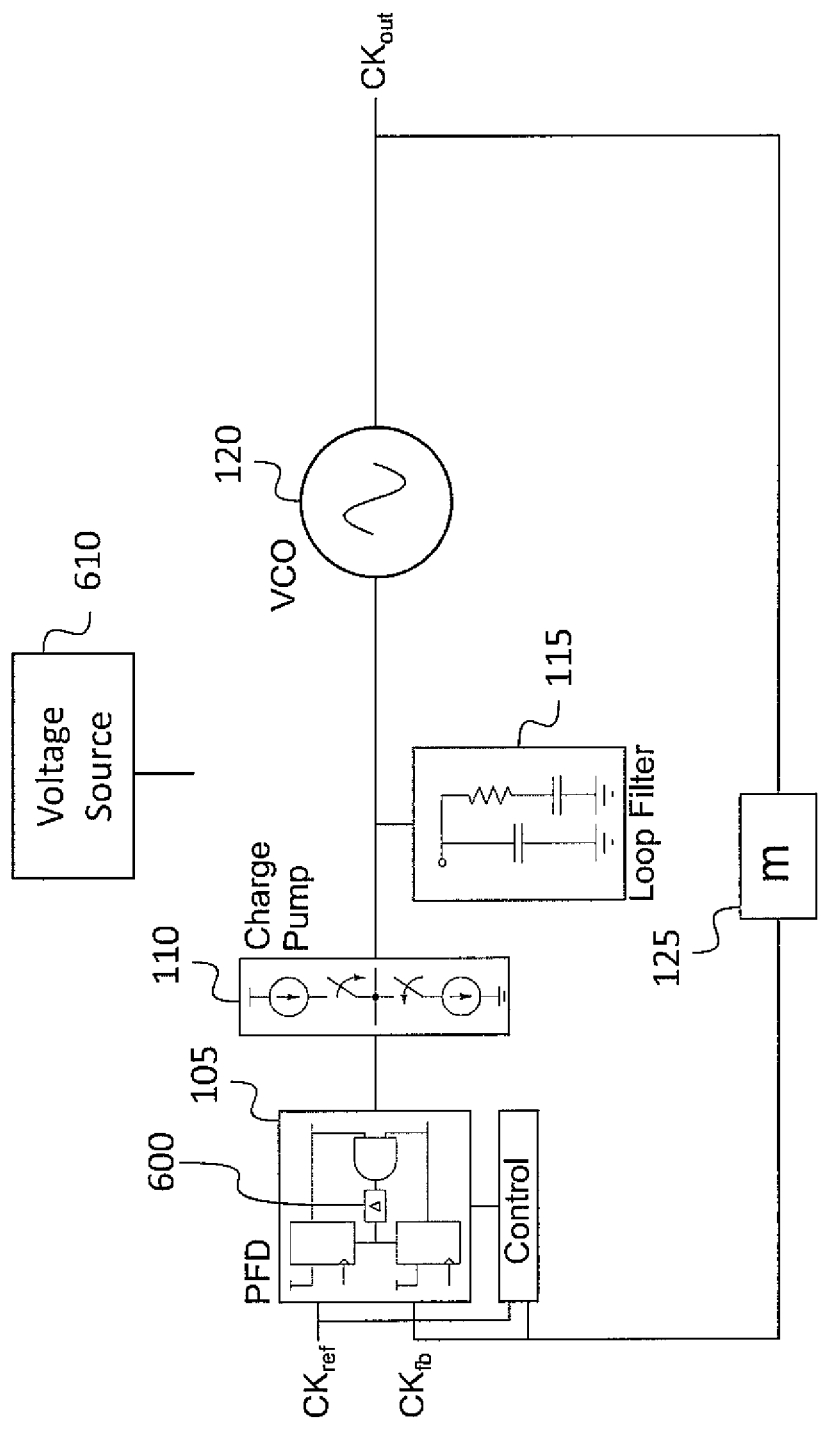
FIG. 6 is a block diagram of a phase locked loop, according to an embodiment of the present invention.

Referring to FIG. 6, in one embodiment a PLL differs from the PLL illustrated in FIG. 1 in that the PFD includes an adjustable delay block 600 (or "variable delay") in the reset signal path, e.g., connected between the output of the AND gate 215 and the reset inputs of the first flip-flop 205 and the second flip-flop 210 (shown in greater detail in FIG. 2). The adjustable delay block 600 provides an adjustable delay in the reset path, and, accordingly, an adjustable reset width, which forms a window within which edges are missed.

Figure 7:
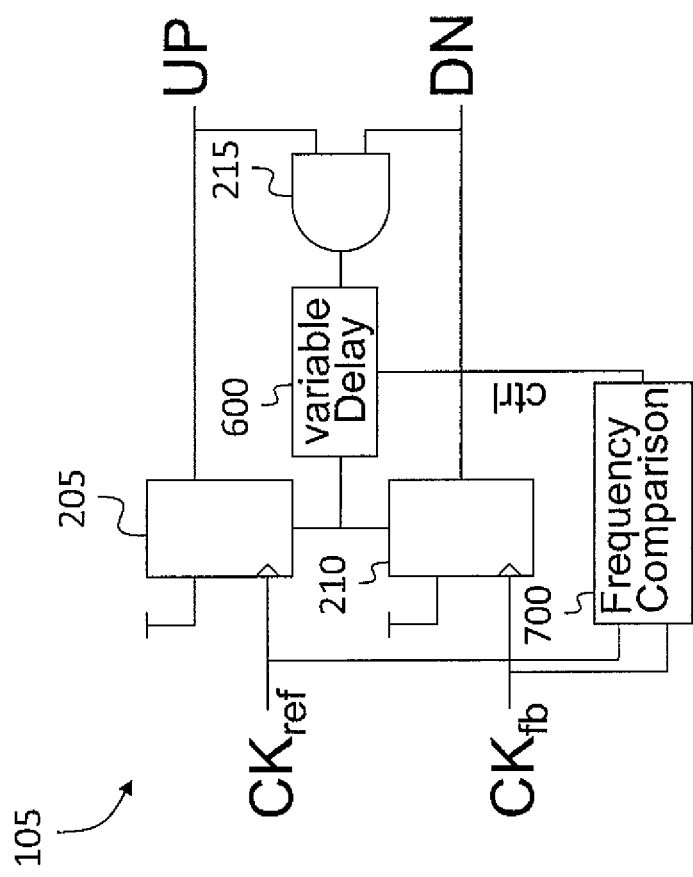
FIG. 7 is a schematic diagram of a phase frequency detector, according to an embodiment of the present invention.

Referring to FIG. 7, in one embodiment, a feedback loop is used to adjust the delay such that the desired ratio is achieved. The feedback controller 700 (which may perform a frequency comparison and is labeled "Frequency Comparison" in FIG. 7) may have an output connected to a control input of the adjustable delay block 600 (this control input is not shown in FIG. 6). The feedback controller 700 may be implemented as a circuit or process that first counts the number of edges of both signals (CKref and CKfb) and then adjusts a variable delay line in the PFD, accordingly. For example, if the target ratio is 5/6 (a ratio of 1.25, e.g., a feedback clock frequency of $f_{out}$=1.25 GHz if the reference clock is 1.5 GHz), then the circuit may count edges in both clock signals until it has counted 300 edges of the reference clock. At that point, if the number of edges of the feedback clock is greater than 5/6 of 300, i.e., greater than 250, the circuit may increase the delay; if the number of edges of the feedback clock is less than 250, the circuit may decrease the delay.

The PLL (FIG. 6) may include a first control loop (including the phase frequency detector 105, the charge pump circuit 110, the loop filter 115, the voltage controlled oscillator 120, and the divider 125), with a first bandwidth (e.g., a first unity-gain frequency). The feedback controller 700 (FIG. 7) may form part of a second control loop around the adjustable delay block, with a second bandwidth (e.g., a second unity-gain frequency). In one embodiment the second bandwidth is less than (e.g., it is at most one tenth) the first bandwidth.

Ratios greater than 1, i.e., (N+1)/N ratios, may be generated by resetting the VCO at a higher frequency than the reference clock. For example, a voltage source 610 (FIG. 6), such as a fixed voltage reference or a controllable voltage source (e.g., a voltage-mode analog to digital converter), may be connected to the loop filter to charge it to a set or predetermined voltage before the loop begins to operate (e.g., with the charge pump disabled). At startup, when the loop is enabled, the controllable voltage source may be disconnected from the loop filter, and the voltage to which the loop filter has been charged may then determine the initial control voltage and the initial frequency of the VCO 120. The voltage source 610 is shown in FIG. 6 in the disconnected state. When the initial VCO control voltage corresponds to an output frequency that when divided by the divider 125 results in a feedback clock frequency that is higher than the reference clock frequency, the equilibrium operating frequency may be one in which the feedback clock frequency is (N+1)/N times the reference clock frequency. When the initial VCO control voltage corresponds to an output frequency that when divided by the divider 125 results in a feedback clock frequency that is lower than the reference clock frequency, the equilibrium operating frequency may be one in which the feedback clock frequency is N/(N+1) times the reference clock frequency. In each case, the output frequency may be an integer multiple times the feedback clock frequency, so that the output frequency may be mN/(N+1) or m(N+1)/N times the reference clock frequency, where both m and N are integers.

Cascading two or more such PLLs may enable the generation of different ratios of the reference clock. Such cascade mechanism may also be used to filter the induced jitter. For example, a fractional PLL according to an embodiment of the present invention may produce an output at a frequency of mN/(N+1) of the reference frequency, and a second PLL cascaded with the first may multiply the frequency by k (where k is an integer), so that the output frequency of the second PLL is kmN/(N+1) times the reference frequency. If a divider is omitted from the first PLL, then the ratio may be kN/(N+1).

Figure 8:
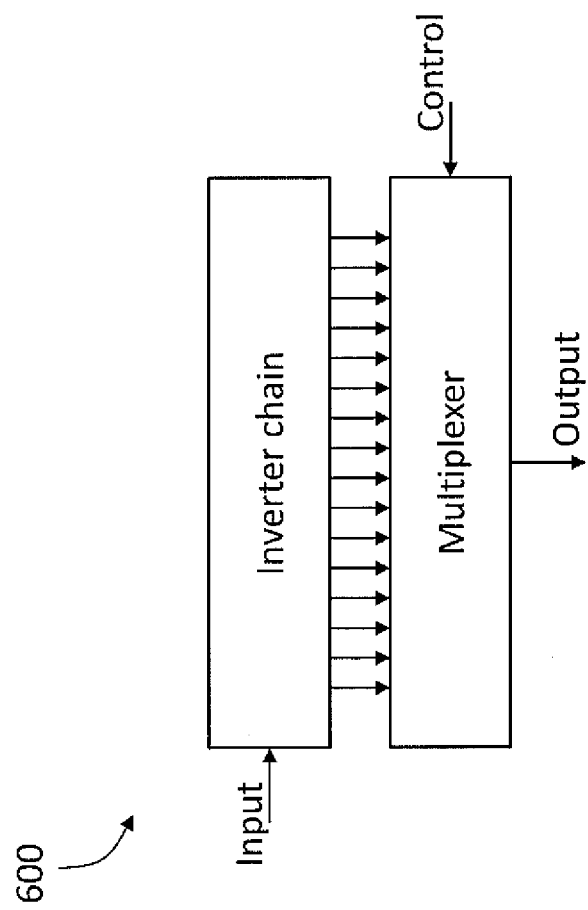
FIG. 8 is a block diagram of an adjustable delay block, according to an embodiment of the present invention.
Figure 9:
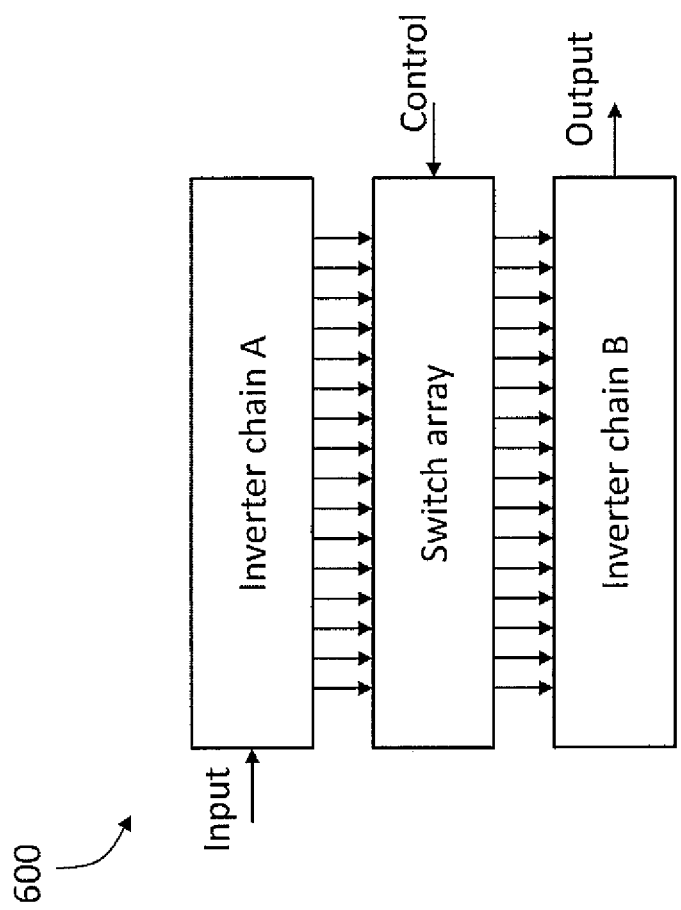
FIG. 9 is a block diagram of an adjustable delay block, according to another embodiment of the present invention.

In one embodiment, a fixed delay block (e.g., composed of a chain of inverters connected in cascade) is used instead of an adjustable delay block 600. The adjustable delay block 600 may be implemented using various circuit configurations. In one embodiment the adjustable delay block is (or includes) a current-mode logic (CML) stage configured to have a variable (e.g., voltage-controlled or current-controlled) bandwidth, and thereby to provide a variable delay. Referring to FIG. 8, in one embodiment, a chain of cascaded inverters is connected to a multiplexer such that the output of every other inverter is connected to the multiplexer. The control input of the multiplexer then selects which inverter output is connected to the output, and, accordingly, the number of inverter pairs the signal propagates through before being routed, through the multiplexer, to the output. For additional adjustability, one or more of the inverters may be a current-starved complementary metal-oxide semiconductor (CMOS) inverter, having a propagation delay depending on the (controllable) current limit. In one embodiment a fixed-length chain of inverters connected in cascade is used (without a multiplexer), and one or more of the inverters in the chain is current-starved and accordingly has an adjustable propagation delay. Referring to FIG. 9, in one embodiment implementing a Vernier adjustable delay block, a first chain of inverters (inverter chain A) has a first propagation delay per inverter, and a second inverter chain B has a second, slightly different, propagation delay per inverter. A switch array includes a switch between each output of the first chain of inverters and the input of the inverter immediately following a corresponding inverter in the second chain of inverters. One switch in the switch array is turned on at any time; which switch is turned on determines how many of the inverters in the first chain of inverters the signal propagates through before then propagating through the remaining corresponding inverters in the second chain of inverters. For example if the first chain of inverters includes 10 inverters, and the second chain of inverters includes 10 inverters with slightly lower delay, then if the fourth switch is turned on, the signal may propagate through four inverters in the first chain of inverters, and six inverters in the second chain of inverters. If the fifth switch is turned on instead of the fourth switch, then the signal will propagate through five inverters in the first chain of inverters, and five inverters in the second chain of inverters, resulting in a decrease in total propagation delay that is equal to the difference between the respective propagation delays in the fifth inverters in the two chains.

Figure 10:
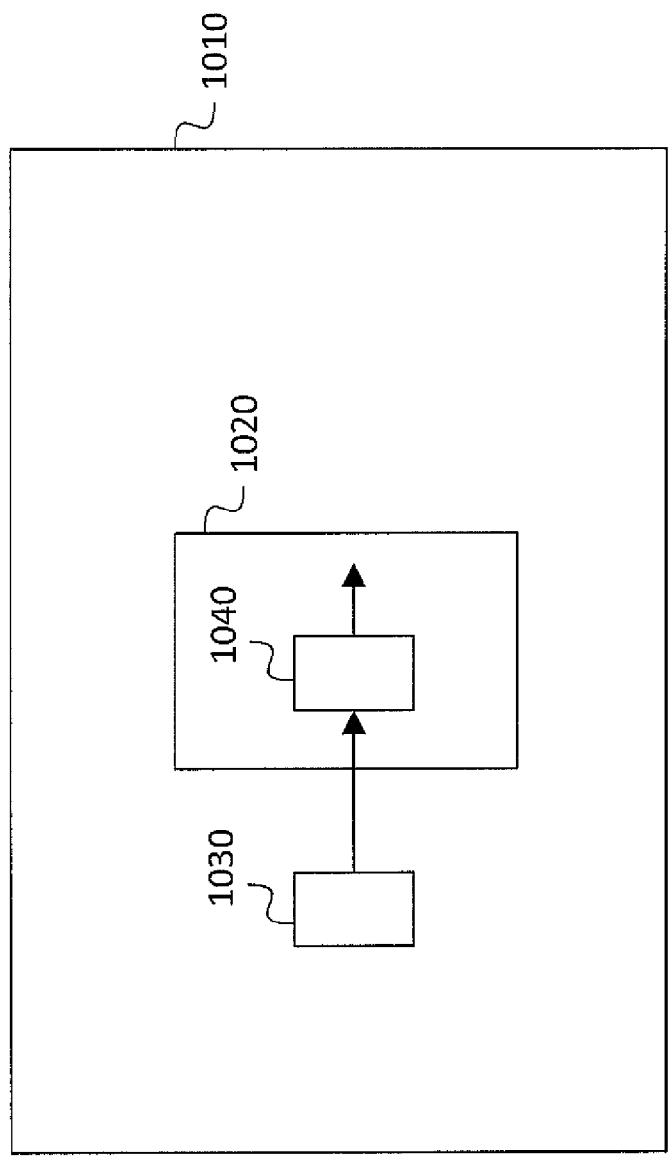
FIG. 10 is a block diagram of a display, according to an embodiment of the present invention.

Referring to FIG. 10, in one embodiment a display 1010 includes a timing controller (TCON) 1020 and a reference oscillator 1030. The TCON 1020 includes a PLL 1040 according to an embodiment of the present invention. The PLL 1040 receives a first clock signal from the reference oscillator and generates a second clock signal that is used for synchronization within the TCON 1020.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a fractional PLL using a linear PFD with adjustable delay have been specifically described and illustrated herein, many modifications and variations will be apparent to those skilled in the art. Accordingly, it is to be understood that a fractional PLL using a linear PFD with adjustable delay constructed according to principles of this invention may be embodied other than as specifically described herein. The invention is also defined in the following claims, and equivalents thereof.

What is claimed is:

1. A phase-locked loop, comprising:
 a voltage-controlled oscillator having:
  a control input; and
  a clock output; and
 a phase frequency detector having:
  a reference clock input;
  a feedback clock input;
  an up output configured to be either in a set state or a reset state; and
  a down output configured to be either in a set state or a reset state,
 the up output and the down output of the phase frequency detector being operably connected to the control input of the voltage-controlled oscillator,
 the clock output of the voltage-controlled oscillator being operably connected to the feedback clock input of the phase frequency detector,
 the phase frequency detector comprising an adjustable delay block configured to adjust an output frequency of the phase-locked loop by delaying, by an adjustable delay time:

a transition of the up output from the set state to the reset state, and
a transition of the down output from the set state to the reset state.

2. The phase-locked loop of claim 1, wherein the phase frequency detector comprises:
a first flip-flop operably connected to the reference clock input;
a second flip-flop operably connected to the feedback clock input;
the adjustable delay block, operably connected to a reset input of each of:
the first flip-flop; and
the second flip-flop; and
an AND gate operably connected to an output of each of:
the first flip-flop; and
the second flip-flop; and
an output of the AND gate being operably connected to an input of the adjustable delay block.

3. The phase-locked loop of claim 1, wherein the adjustable delay block comprises a current mode logic stage with adjustable bandwidth.

4. The phase-locked loop of claim 1, wherein the adjustable delay block comprises a current-starved inverter.

5. The phase-locked loop of claim 1, wherein the adjustable delay block comprises a first plurality of inverters operably connected in cascade.

6. The phase-locked loop of claim 5, where an inverter of the first plurality of inverters is a current-starved complementary metal-oxide semiconductor inverter.

7. The phase-locked loop of claim 5, wherein the adjustable delay block further comprises a multiplexer with a plurality of inputs each operably connected to an output of a respective inverter of the plurality of inverters.

8. The phase-locked loop of claim 5, wherein the adjustable delay block further comprises a second plurality of inverters operably connected in cascade, each of the inverters of the second plurality of inverters having a different propagation delay from a corresponding inverter of the first plurality of inverters.

9. The phase-locked loop of claim 8, further comprising an array of switches, each switch of the array of switches being operably connected between an output of an inverter of the first plurality of inverters and an output of an inverter of the second plurality of inverters.

10. The phase-locked loop of claim 1, further comprising a delay controller, having an output operably connected to a control input of the adjustable delay block.

11. The phase-locked loop of claim 10, wherein the delay controller further has a first input operably connected to the reference clock input, and a second input operably connected to the feedback clock input.

12. The phase-locked loop of claim 11, wherein the delay controller is configured to count edges of respective signals at the reference clock input and at the feedback clock input.

13. The phase-locked loop of claim 10, wherein the delay controller is a part of a control loop including the adjustable delay block, the control loop having a bandwidth less than a control bandwidth of a control loop, of the phase-locked loop, including the voltage-controlled oscillator.

14. The phase-locked loop of claim 10, further comprising a voltage source configured to be selectively operably connected to the control input of the voltage-controlled oscillator.

15. The phase-locked loop of claim 10, wherein the adjustable delay block comprises a first plurality of inverters operably connected in cascade.

16. The phase-locked loop of claim 15, wherein the adjustable delay block further comprises a multiplexer with a plurality of inputs each operably connected to an output of a respective inverter of the plurality of inverters.

17. The phase-locked loop of claim 15, wherein the adjustable delay block further comprises a second plurality of inverters operably connected in cascade, each of the inverters of the second plurality of inverters having a different propagation delay from a corresponding inverter of the first plurality of inverters.

18. The phase-locked loop of claim 17, further comprising an array of switches, each switch of the array of switches being operably connected between an output of an inverter of the first plurality of inverters and an output of an inverter of the second plurality of inverters.

19. A display, comprising:
a reference oscillator; and
a timing controller,
the timing controller comprising a phase-locked loop, comprising:
a voltage-controlled oscillator having:
a control input; and
a clock output; and
a phase frequency detector having:
a reference clock input operably connected to an output of the reference oscillator;
a feedback clock input;
an up output configured to be either in a set state or a reset state; and
a down output configured to be either in a set state or a reset state;
the up output and the down output of the phase frequency detector being operably connected to the control input of the voltage-controlled oscillator,
the clock output of the voltage-controlled oscillator being operably connected to the feedback clock input of the phase frequency detector,
the phase frequency detector comprising an adjustable delay block configured to delay, by an adjustable delay time:
a transition of the up output from the set state to the reset state, and
a transition of the down output from the set state to the reset state.

20. A method for operating a phase-locked loop, the phase-locked loop comprising:
a voltage-controlled oscillator having:
a control input; and
a clock output; and
a phase frequency detector having:
a reference clock input;
a feedback clock input;
an up output configured to be either in a set state or a reset state; and
a down output configured to be either in a set state or a reset state,
the up output and the down output of the phase frequency detector being operably connected to the control input of the voltage-controlled oscillator,
the clock output of the voltage-controlled oscillator being operably connected to the feedback clock input of the phase frequency detector,
the phase frequency detector comprising an adjustable delay block,
the method comprising:

delaying, by the adjustable delay block, by an adjustable delay time, a transition of the up output from the set state to the reset state, and delaying, by the adjustable delay block, by the adjustable delay time, a transition of the down output from the set state to the reset state.

* * * * *